United States Patent
Tredwell et al.

(10) Patent No.: US 9,562,979 B2
(45) Date of Patent: Feb. 7, 2017

(54) RADIOGRAPHIC DETECTOR FORMED ON SCINTILLATOR

(71) Applicant: Carestream Health, Inc., Rochester, NY (US)

(72) Inventors: Timothy J. Tredwell, Fairport, NY (US); Roger S. Kerr, Brockport, NY (US); Robert W. Kulpinski, Penfield, NY (US)

(73) Assignee: Carestream Health, Inc., Rochester, NY (US)

( * ) Notice: Subject to any disclaimer, the term of this patent is extended or adjusted under 35 U.S.C. 154(b) by 0 days.

(21) Appl. No.: 14/726,653

(22) Filed: Jun. 1, 2015

(65) Prior Publication Data

US 2015/0260853 A1    Sep. 17, 2015

Related U.S. Application Data

(63) Continuation of application No. 12/512,437, filed on Jul. 30, 2009, now Pat. No. 9,075,150.

(51) Int. Cl.
*G01T 1/20* (2006.01)
*G01T 1/202* (2006.01)
*G01T 1/24* (2006.01)
*H01L 27/146* (2006.01)

(52) U.S. Cl.
CPC ............ *G01T 1/2018* (2013.01); *G01T 1/202* (2013.01); *G01T 1/247* (2013.01); *H01L 27/14663* (2013.01); *H01L 27/14683* (2013.01); *G01T 1/20* (2013.01)

(58) Field of Classification Search
CPC ........... G01T 1/2018; G01T 1/202; G01T 1/20

USPC ............. 250/370.11, 370.09, 367; 378/62
See application file for complete search history.

(56) References Cited

U.S. PATENT DOCUMENTS

| | | |
|---|---|---|
| 7,050,538 B2 | 5/2006 | Tashiro et al. |
| 7,567,646 B2 | 7/2009 | Buchinsky |
| 7,968,853 B2 | 6/2011 | Altman et al. |
| 2006/0151708 A1* | 7/2006 | Bani-Hashemi ...... G01T 1/2008 250/370.11 |
| 2007/0096033 A1 | 5/2007 | Freund et al. |
| 2007/0120062 A1 | 5/2007 | Li et al. |
| 2008/0011960 A1 | 1/2008 | Yorkston et al. |
| 2008/0245968 A1* | 10/2008 | Tredwell ............... G01T 1/2018 250/370.09 |

(Continued)

FOREIGN PATENT DOCUMENTS

| | | |
|---|---|---|
| CN | 201965237 U | 9/2011 |
| JP | 2002-227859 A | 9/2002 |

(Continued)

OTHER PUBLICATIONS

IEEE Transactions on Nuclear Science, "Enhanced Columnar Structure in CsI Layer by Substrate Patterning", Jing et al., vol. 39, No. 5, Oct. 1992, pp. 1195-1198.

(Continued)

*Primary Examiner* — Yara B Green

(57) ABSTRACT

A projection radiographic imaging apparatus includes a scintillator and an imaging array. The imaging array includes a plurality of pixels formed directly on a side of the scintillator. Each of the pixels includes at least one photosensor and at least one readout element.

19 Claims, 8 Drawing Sheets

(56) References Cited

U.S. PATENT DOCUMENTS

2010/0282973 A1* 11/2010 Schulz .................. G01T 1/1603
250/363.01

FOREIGN PATENT DOCUMENTS

| JP | 2009-133837 A | 6/2009 |
| WO | WO 2006/114716 | 11/2006 |
| WO | WO 2008/051390 | 5/2008 |
| WO | WO 2009/060968 | 5/2009 |

OTHER PUBLICATIONS

Philips Res. Repts, "Vapour-Deposited CsI: Na Layers, II Screens for Application in X-Ray Imaging Devices", A.L.N. Stevels et al., vol. 29, pp. 353-362, 1974.
Partial EP Search Report for European Application No. 10007519.1 mailed Jun. 5, 2013, 3 pages.

* cited by examiner

RADIOGRAPHIC DETECTOR FORMED ON SCINTILLATOR

CROSS REFERENCE TO RELATED APPLICATIONS

This application is a Continuation of earlier filed application U.S. Ser. No. 12/512,437, filed on Jul. 30, 2009, entitled "RADIOGRAPHIC DETECTOR FORMED ON SCINTILLATOR", in the names of Timothy J. Tredwell, et al.

FIELD OF THE INVENTION

This invention generally relates to digital radiographic imaging and more particularly relates to a flat panel imaging apparatus having a scintillating phosphor screen with an imaging array of photosensors and thin-film transistor readout devices formed directly on the scintillating phosphor screen.

BACKGROUND OF THE INVENTION

Generally, medical X-ray detectors employing a scintillating phosphor screen to absorb X-rays and produce light suffer the loss of spatial resolution due to lateral light diffusion in the phosphor screen. To reduce lateral light diffusion and maintain acceptable spatial resolution, the phosphor screens must be made sufficiently thin.

The spatial resolution and X-ray detection ability of an imaging apparatus are often characterized by the modulation transfer function (MTF) and X-ray absorption efficiency, respectively. Thin phosphor screens produce better MTF at the expense of reduced X-ray absorption. Usually, the coating density and the thickness of the phosphor screen are used in the design tradeoff between spatial resolution and X-ray absorption efficiency.

For example, the Lanex Fine and the Lanex Fast Back screens are two typical commercial screens, both manufactured by Eastman Kodak Co. Both are made of $Gd_2O_2S(Tb)$ phosphor. The Lanex Fast Back screen is relatively thicker and absorbs X-rays more efficiently, but has lower resolution than the Lanex Fine screen. On the other hand, the Lanex Fine screen is thinner than the Lanex Fast Back screen, absorbs X-rays relatively less efficiently, but has higher resolution. The coating density of the Lanex Fine and the Lanex Fast Back screens are 34 mg/cm$^2$ and 133 mg/cm$^2$, respectively. The Lanex Fine and the Lanex Fast Back screens have X-ray absorption efficiencies of 24% and 63% (for 80 kVp, with tungsten target, 2.5-mm Al inherent filtration, and filtered by 0.5-mm Cu+1.0-mm Al) and MTF values of 0.26 and 0.04 at 5 c/mm, respectively.

Recently, digital flat panel X-ray imagers based upon active matrix thin film electronics have become a promising technology for applications such as diagnostic radiology and digital mammography. There are two types of X-ray energy conversion methods used in digital radiography (DR), namely, the direct and indirect method. In the direct method, the X-rays absorbed in a photoconductor are directly transduced into a charge signal, stored on the pixel electrodes on an active matrix array (AMA) and read out using thin film transistors (TFTs) to produce a digital image. Amorphous selenium (a-Se) is usually used as the photoconductor.

In the indirect method, a single phosphor screen is used to absorb X-rays and the resultant light photons are detected by an AMA with a single photodiode (PD) and a TFT switch at each pixel. The photodiode absorbs the light given off by the phosphor in proportion to the X-ray energy absorbed. The stored charge is then read out, like the direct method, using the TFT switch. Common phosphor materials include powder phosphors such as $Gd_2O_2S(Tb)$ and structured phosphors such as CsI(Tl). Amorphous hydrogenated silicon (a-Si:H) is commonly used to form the photodiode and the TFT switch in the indirect method.

FIG. 1A shows a cross-section (not to scale) of a single imaging pixel 10 in a prior art a-Si-based flat panel imager used in the indirect method and FIG. 1B shows a schematic top-view of a plat panel imager 80 including an array of such pixels 10. Each imaging pixel 10 has a photodiode 70 and a TFT switch 71. A layer of X-ray converter (e.g., luminescent phosphor screen 12) is coupled to the photodiode-TFT array. Photodiode 70 comprises the following layers: a passivation layer 14, an indium tin oxide layer 16, a p-doped Si layer 18, an intrinsic a-Si:H layer 20, an n-doped Si layer 22, a metal layer 24, a dielectric layer 26, and a glass substrate 28. An X-ray photon path 30 and a visible light photon path 32 are also shown in FIG. 1A. As illustrated, when a single X-ray is absorbed by the phosphor, a large number of light photons are emitted isotropically. Only a fraction of the emitted light reaches the photodiode and gets detected.

As shown in FIG. 1B, the flat panel imager 80 consists of a sensor array 81 including a matrix of the a-Si n-i-p photodiodes 70 and TFTs 71. Gate driver chips 82 are connected to the blocks of gate lines 83 and readout chips are connected to blocks of data lines 84 and bias lines 85. Each of the data lines 84 has an associated charge amplifier 86. The amplifiers preferably include double correlated sampling circuits with programmable filtering (not shown), and are in communication with an analog multiplexer 87, which in turn communicates with an analog-to-digital converter (ADC) 88, to stream out the digital image data at desired rates.

The operation of the a-Si based indirect flat panel imager is known by those skilled in the art, and thus only a brief description is given here. Incident X-ray photons are converted to optical photons in the phosphor screen 12, and these optical photons are subsequently converted to electron-hole pairs within the a-Si:H n-i-p photodiodes 70. In general, a reverse bias voltage is applied to the bias lines 85 to create an electric field (and hence a depletion region) across the photodiodes and enhance charge collection efficiency. The pixel charge capacity of the photodiodes is determined by the product of the bias voltage and the photodiode capacitance. The image signal is integrated by the photodiodes while the associated TFTs 71 are held in a non-conducting ("off") state. This is accomplished by maintaining the gate lines 83 at a negative voltage. The array is read out by sequentially switching rows of TFTs to a conducting state by means of TFT gate control circuitry. When a row of pixels is switched to a conducting ("on") state by applying a positive voltage to the corresponding gate line 83, charge from those pixels is transferred along the data lines 84 and integrated by the external charge-sensitive amplifiers 86. The row is then switched back to a non-conducting state, and the process is repeated for each row until the entire array has been read out. The signal outputs from the external charge-sensitive amplifiers 86 are transferred to the analog-to-digital converter (ADC) 88 by the parallel-to-serial multiplexer 87, subsequently yielding a digital image. The flat panel imager is capable of both single-shot (radiographic) and continuous (fluoroscopic) image acquisition.

The conventional scintillating phosphor screen imaging panel has three basic components: a substrate of glass or other rigid, transparent material, a TFT layer formed on the substrate, and a phosphor layer containing the scintillator material. There would be advantages in simplifying the design of the imaging panel and reducing size, weight, and cost by eliminating components that are not directly involved in obtaining the image data.

SUMMARY OF THE INVENTION

It is an object of the present invention to provide a projection radiographic imaging apparatus that has a simplified and lightweight design and improved detection and display characteristics.

In one aspect, the present invention relates to a projection radiographic imaging apparatus that includes a scintillator and an imaging array. The imaging array includes a plurality of pixels formed directly on a side of the scintillator. Each of the pixels includes at least one photosensor and at least one readout element.

According to another aspect, the present invention includes a method of making a radiographic imaging device. That method includes a step of forming a release layer on a temporary substrate. The method also includes forming an imaging array including a plurality of photosensors and a plurality of thin-film transistor readout elements on the release layer. A scintillator is formed on the imaging array, and the release layer is activated to remove the array from the temporary substrate.

In yet another embodiment, the present invention provides a radiographic imaging panel that includes a first scintillator having a first thickness and a second scintillator having a second thickness. An imaging array is formed on the first scintillator and disposed between the first and second scintillators. The imaging array includes a plurality of photosensors and a plurality of thin-film transistor readout elements.

According to a still further aspect, the present invention provides a radiographic imaging panel including first and second scintillators, having respective first and second thicknesses, and an imaging array disposed directly on one of the first and second scintillators. The imaging array includes a plurality of pixel elements and is positioned between the first and second scintillators. Each pixel element includes a first photosensor optically coupled to the first scintillator, a second photosensor optically coupled to the second scintillator, and a readout element electrically coupled to the first and second photosensors and disposed directly on one of the first and second scintillators.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings.

DETAILED DESCRIPTION OF THE INVENTION

The present description is directed in particular to elements forming part of, or cooperating more directly with, apparatuses and methods in accordance with the invention. It is to be understood that elements not specifically shown or described may take various forms well known to those skilled in the art.

In the description that follows, terms and phrases such as "above" or "on top of" are used in a broad sense, to indicate an arrangement of layers relative to each other. Certainly, an X-ray imaging plate may be exposed in any orientation, where stacked layers extend in generally horizontal, vertical, or oblique directions.

The general approach of the present invention eliminates the need for a separate substrate material in forming an imaging panel for radiographic imaging. In the various embodiments of the present invention, the scintillator material of the imaging panel serves as the substrate on which photosensor and TFT readout elements are formed. That is, a separate substrate layer is not needed; the scintillator material serves as the substrate for an imaging panel.

Figure 1A:
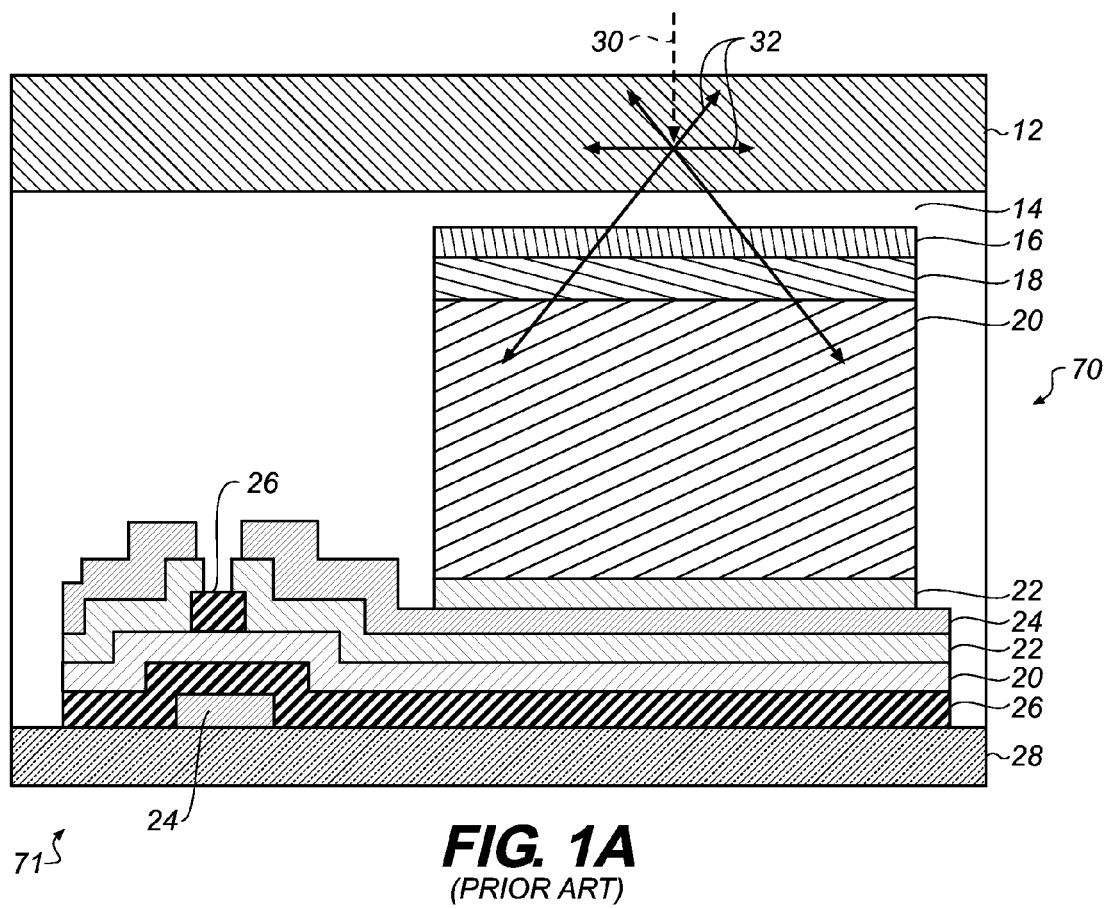
FIG. 1A is a cross-sectional view showing an imaging pixel in a prior art flat-panel imager.
Figure 1B:
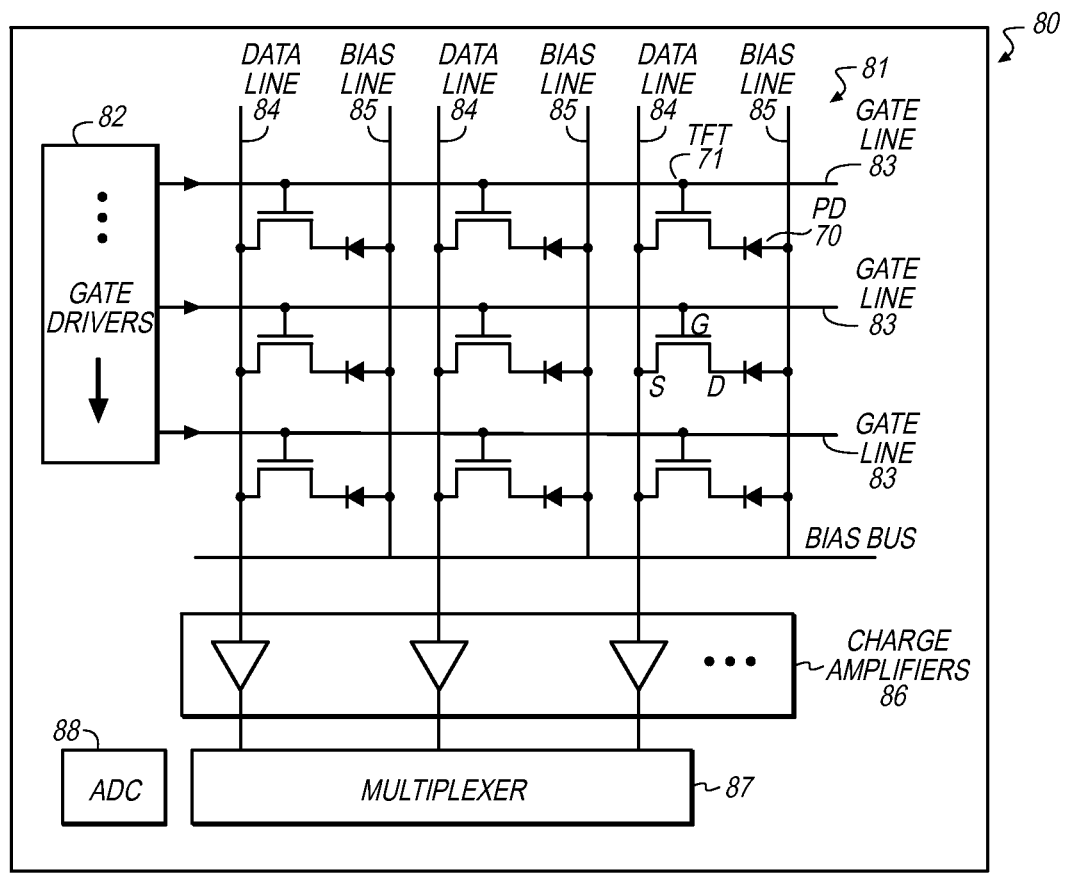
FIG. 1B is a schematic diagram showing components of a prior art flat-panel imager.
Figure 2:
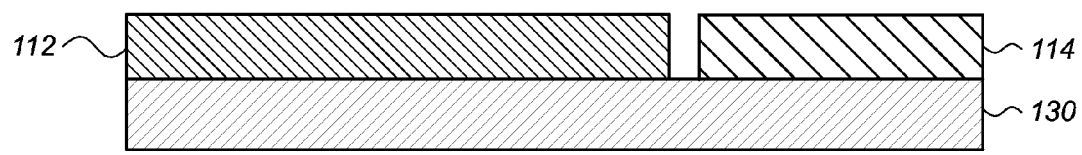
FIG. 2 is a cross-sectional view of a pixel element according to one embodiment of the present invention.

Referring to FIG. 2, there is shown, in cross-section, the structure of a pixel element 110 for use on an imaging panel of a projection radiographic imaging apparatus according to a preferred embodiment of the invention. The pixel element 110 includes a photosensor 112 and a readout element 114 (illustrated in FIG. 2 as, but not limited to, a TFT). Each pixel element 110 also includes a corresponding portion of a scintillator layer 130, or scintillating phosphor layer, that provides light energy to the photosensor 112. The scintillator layer 130 serves a dual-purpose function, namely, providing both the scintillating phosphor material and the substrate on which both photosensor 112 and TFT readout element 114 are disposed.

Photosensor 112 can be any of a number of types of devices. For example, photosensor 112 can be a segmented or non-segmented metal-insulating semiconductor (MIS). Alternately, photosensor 112 can be a segmented or non-segmented photodiode or a phototransistor. Photosensors are generally well-known in the art, and the invention is not limited to any specific type of photosensor.

Figure 3:
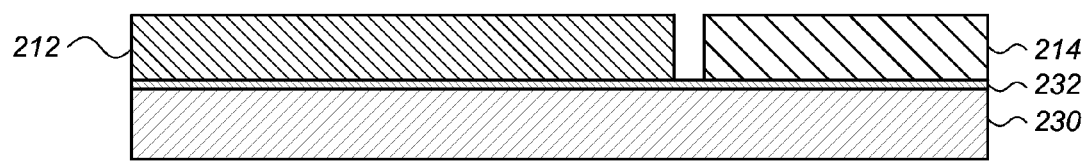
FIG. 3 is a cross-sectional view of a pixel element according to another embodiment of the invention.

FIG. 3 illustrates the structure of an alternate pixel element 210 for use in a projection radiographic imaging apparatus. This element is similar to that shown in FIG. 2, but a scintillator layer 230 has a barrier layer 232, such as a thin coating, that isolates the scintillator layer 230 from a photosensor 212 and a TFT readout element 214. This arrangement allows the photosensor 212 and TFT readout element 214 to be formed on the scintillator layer 230, but with reduced likelihood that phosphor materials might diffuse into and degrade TFT semiconductor components. The barrier layer 232 can be an inorganic material such as silicon nitride, for example, or an organic material such as polyimide or BCB. The barrier layer 232 could alternately be a sol-gel.

Figure 4:
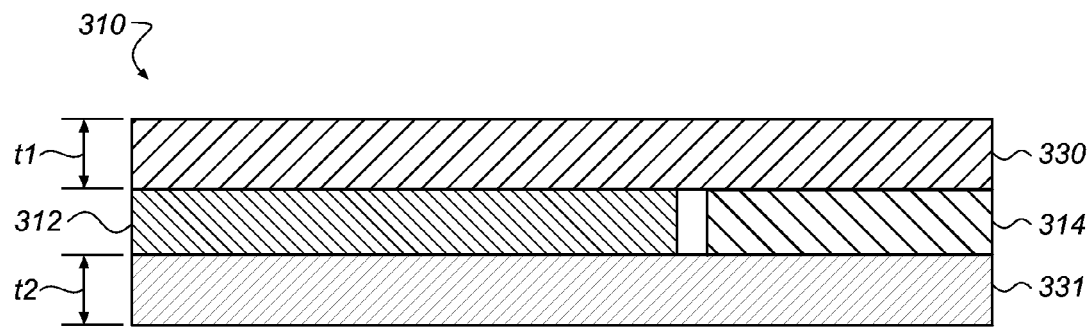
FIG. 4 is a cross-sectional view of a pixel element according to yet another preferred embodiment of the invention.

Referring to FIG. 4, there is shown another embodiment of the invention in which an alternate pixel element 310 has two, first and second, scintillator layers 330, 331, each with a corresponding thickness t1, t2. In this embodiment, a photosensor 312 and a TFT readout element 314 are arranged between the first and second scintillator layers 330, 331, being formed on one of the scintillator layers 330, 331.

Figure 5:
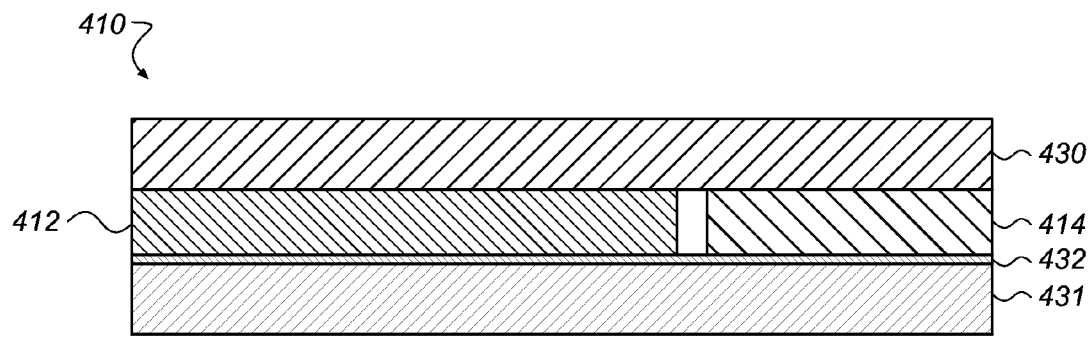
FIG. 5 is a cross-sectional view of a pixel element according to yet another preferred embodiment of the invention.

FIG. 5 shows another embodiment of a pixel element 410, which combines the embodiments illustrated in FIGS. 3 and 4. Here, a barrier layer 432 lies between the imaging electronics of a photosensor 412 and a TFT readout element 414 and a second scintillator layer 431. A first scintillator layer 430 is formed on a side of the photosensor 412 and readout element 414 opposite the second scintillator layer 431. In an alternative embodiment, the barrier layer could instead be between the photosensor 412 and the TFT readout element 414 and first scintillator 430. Moreover, two barrier layers could be provided, one between the photosensor 412 and the TFT 414 and each of the scintillators 430, 431.

Figure 6:
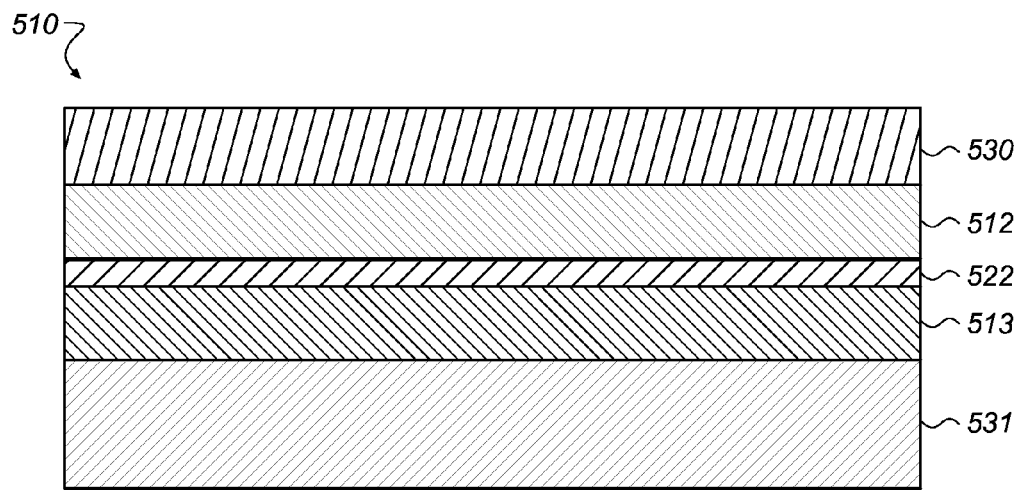
FIG. 6 is a cross-sectional view of a portion of a pixel element according to yet another preferred embodiment of the invention.

FIG. 6 illustrates yet another embodiment of a pixel element 510 according to the invention. In this embodiment, first and second photosensors 512, 513 are stacked atop each other. An opaque light shield layer 522 is provided between the first and second photosensors 512, 513. To reduce optical crosstalk between the first and second photosensors 512, 513 for each of first and second scintillator layers 530, 531, the light shield layer 522 helps to isolate the first photosensor 512 so that it receives light only from the first scintillator layer 530. Similarly, the light shield layer 522 helps to isolate the second photosensor 513 so that it receives light only from the second scintillator layer 531.

Figure 7:
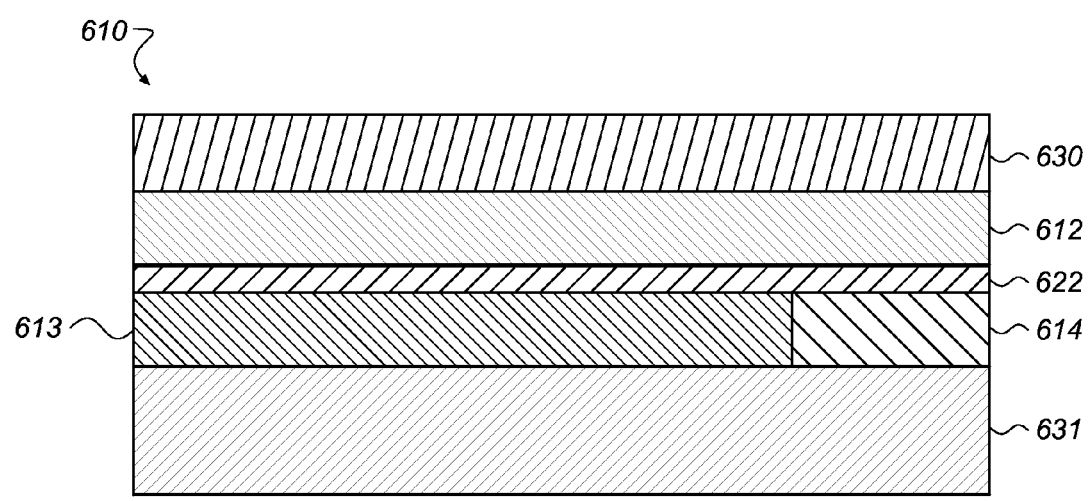
FIG. 7 is a cross-sectional view of a pixel element according to still another preferred embodiment of the invention.

Although not illustrated, the pixel element 510 shown in FIG. 6 preferably also includes one or more readout elements associated with the photosensors 512, 513. FIG. 7 shows just such an embodiment. In FIG. 7, a pixel element 610 includes first and second photosensors 612, 613 separated by a light shield layer 622. The first photosensor 612 is formed on a first scintillator layer 630 and the second photosensor 613 is formed on a second scintillator layer 631. A readout element 614 also is included in this embodiment. As illustrated, the second photosensor 613 and the TFT readout element 614 are formed on the same layer, that is, fabricated on the same plane. The TFT readout element 614 preferably is used to read photosensor values from each layer with this arrangement. The readout elements 614 alternatively could be present on the same layer as first photosensor 612 or could be on an entirely different layer.

Figure 8:
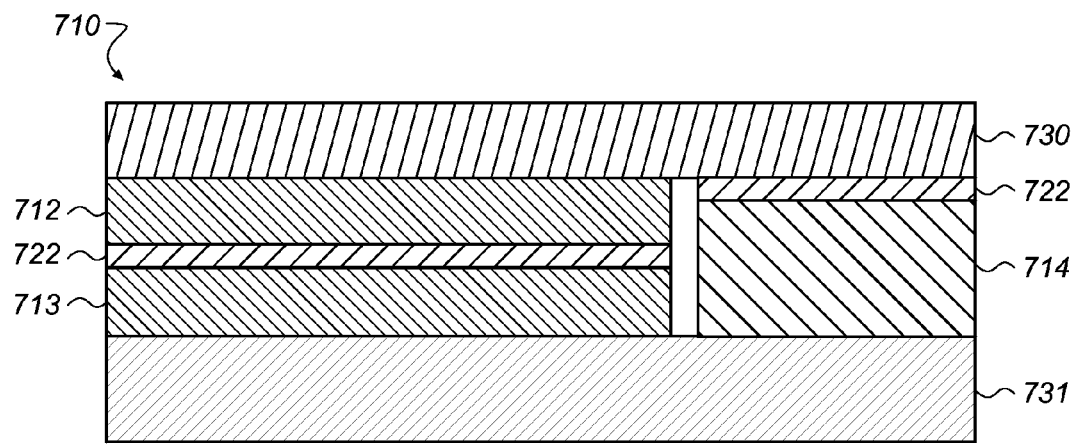
FIG. 8 is a cross-sectional view of a pixel element according to still another preferred embodiment of the invention.

Other arrangements also are contemplated. For example, FIG. 8 shows another novel pixel element 710 in which first and second photosensors 712, 713 are stacked, with a switching TFT readout element 714 arranged to a side of the stack. Multiple light shield layers 722 are used in this embodiment, to help prevent optical crosstalk as well as to limit the exposure of the TFT readout element 714 to illumination, which can add noise to the x-ray data. The TFT readout element 714 is formed on the second scintillator layer 731, fabricated on the same plane as the second photosensor 713. This places the thin-film transistor readout element 714 alongside the stacked photosensors 712, 713, which are respectively formed on the first and second scintillator layers 730, 731.

Figure 9:
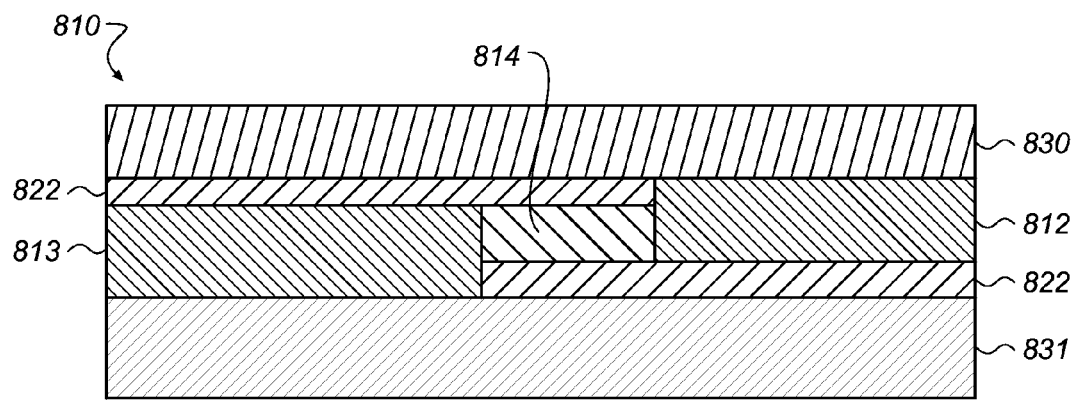
FIG. 9 is a cross-sectional view of a pixel element according to yet another preferred embodiment of the invention.
Figure 10:
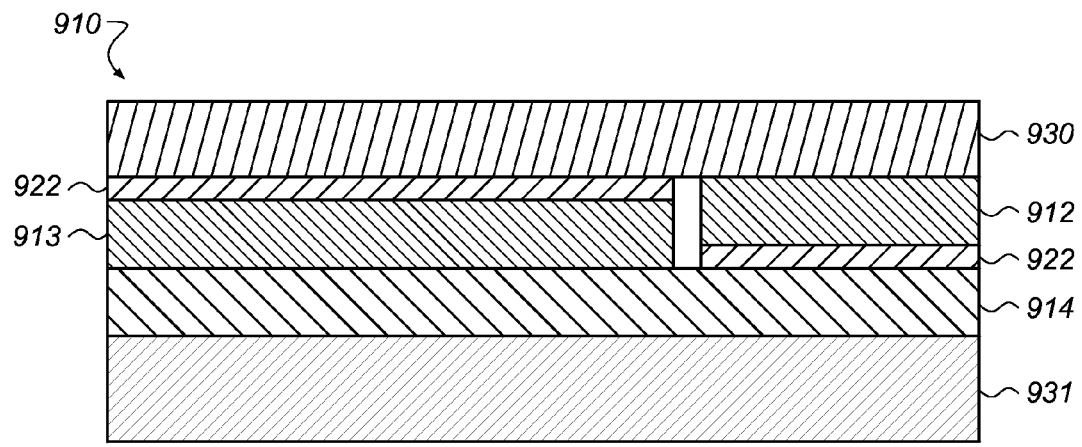
FIG. 10 is a cross-sectional view of a pixel element with dual scintillator layers and multiple photosensors, with light shields and TFT readout circuitry connecting to each photosensor and on a separate layer.

FIG. 9 shows an alternate pixel element 810 in which two photosensors 812, 813 and a switching TFT readout element 814 are formed in the same plane. Protection in the form of light shield layer 822 is provided on both sides of the switching TFT readout element 814. Scintillator layers are noted as 830 and 831. In a similar embodiment shown in FIG. 10, a pixel element 910 includes first and second photosensors 912, 913 fabricated side by side, in the same plane on a first scintillator layer 930, with TFT readout elements 914 disposed on a second scintillator layer 931. Protection in the form of light shield layer 922 is provided on both sides of the switching TFT readout elements 914.

Figure 11:
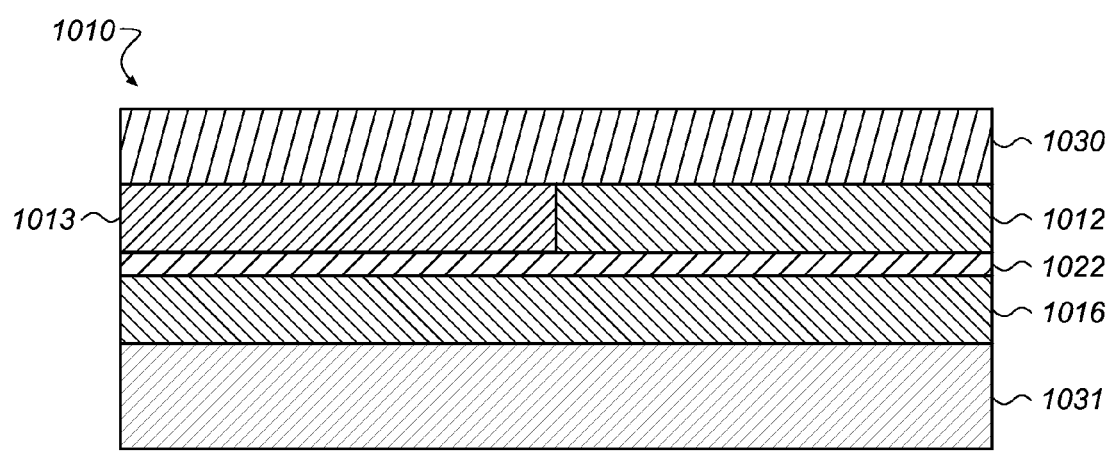
FIG. 11 is a cross-sectional view of a pixel element according to yet another preferred embodiment of the invention.

Referring to FIG. 11, there is shown another pixel element 1010 according to the invention. In this embodiment, the pixel element 1010 includes first and second photosensors 1012, 1013 arranged side-by-side and stacked atop a third photosensor 1016. Here, pixel element 1010 includes multiple photosensing elements, each exhibiting a different response, depending on the spectral content of the emitted light. Protection in the form of light shield layer 1022 is provided. Scintillator layers are noted as 1030 and 1031. TFT readout elements are not shown in this view, although such could be included in arrangements illustrated in FIGS. 12 and 13.

Figure 12:
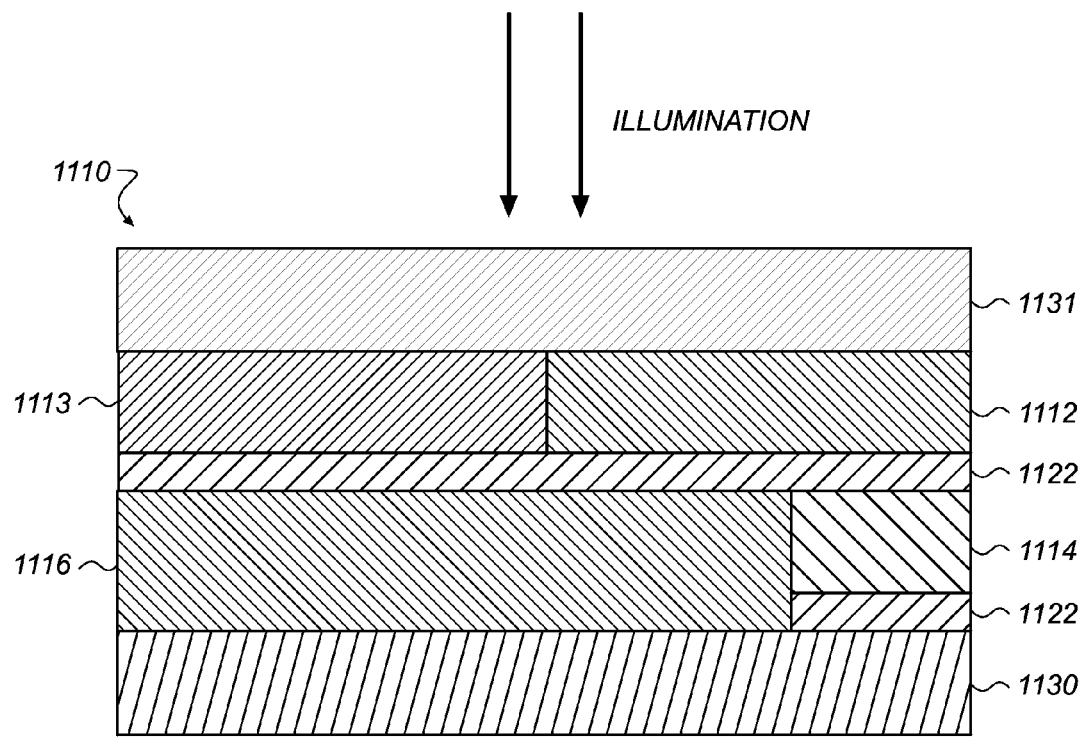
FIG. 12 is a cross-sectional view of a pixel element according to yet another preferred embodiment of the invention.
Figure 13:
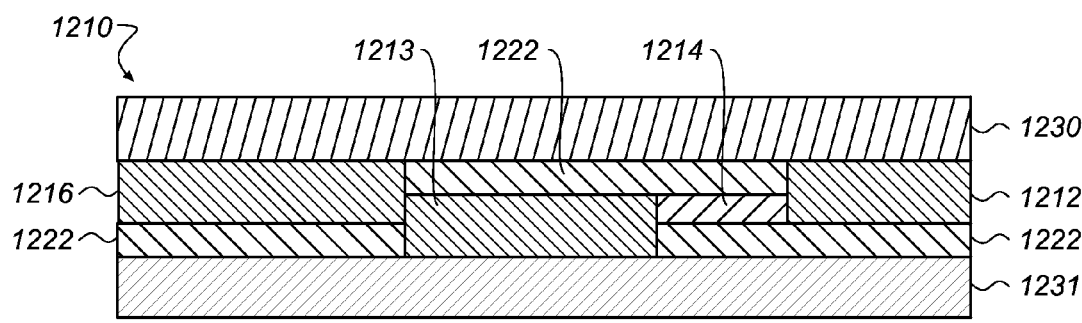
FIG. 13 is a cross-sectional view of a pixel element according to yet another preferred embodiment of the invention.

Specifically, FIG. 12 shows a pixel element 1110 in which first, second, and third photosensors 1112, 1113, and 1116 are included and a TFT readout element 1114 is formed alongside the third photosensor 1116. Also illustrated in FIG. 12 is the direction of X-ray radiation for this design, in one embodiment. Here, since the radiation is first absorbed close to the surface of a second scintillator layer 1131, opposite a first scintillator layer 1130, illumination excited from this layer suffers less optical scattering and the resulting image has higher MTF as a result. Having multiple photosensors 1112, 1113, and 1116 per pixel element allows an image to be sampled at a higher spatial frequency. A light shield layer 1122 also may be provided, such as is illustrated.

In FIG. 13, a pixel 1210 again has three photosensors 1212, 1213, 1216, wherein the different photosensors 1212, 1213, 1216 exhibit different responses, depending on the spectral content of the emitted light. In this embodiment, a TFT readout element 1214 is disposed in the same plane or layer as all three photosensors 1212, 1213, 1216. Multiple light shield layers 1222 also may be provided, such as is illustrated to shield light emitted from first and second scintillators 1230, 1231.

Thus, embodiments of imaging pixel elements according to the invention have been described. In each of these embodiments, an imaging array, including at least one of a photosensor and a readout element is formed directly on a scintillator. According to these embodiments, there is no need for a substrate, as is conventionally used and upon which the imaging array conventionally is formed. These embodiments may also be used in connection with conventional designs using a substrate. For example, when two scintillator layers are used, components of the imaging array may be formed directly on one of the scintillators, as described herein, and other components of the imaging array may be formed on a substrate, on which the other of the scintillator layers also is disposed. In such an embodiment, the two scintillators with accompanying imaging array components may then be "laminated" after construction. In this manner, the benefits of reducing scatter resulting from the substrate are still obtained with one scintillator, whereas the substrate could still provide some structural stability.

Several preferred embodiments of the invention include two scintillator layers of preferably differing thicknesses (although the scintillator layers could be the same thickness). The approach of these embodiments is to utilize multiple scintillator layers in a DR imaging plate to maximize the somewhat conflicting requirements for signal to noise ratio (SNR) and modulation transfer function (MTF). In the embodiments, the first scintillator layer has thickness t1 that is relatively thinner than thickness t2 of the second scintillator layer. With inherently less optical light diffusion, the thinner scintillator layer is optimized for resolution and MTF. Conversely, the thicker scintillator layer is optimized for SNR. For example, the thickness of one phosphor screen may be 97 μm (having a coating weight of 45.3 mg/cm$^2$ of $Gd_2O_2S$:Tb), while the thickness of the other phosphor screen may be 186 μm (having a coating weight of 82.7 mg/cm$^2$ of $Gd_2O_2S$:Tb). The thinner phosphor screen may have a light control layer of black, absorptive material and the thicker phosphor screen may have a light control coating of black absorptive material. Using the typical X-ray beam for general radiography (the DN5 RQA5 beam), the spatial frequency at which the MTF would equal 50% ($f_{1/2}$) is 3.8 c/mm and 2.4 c/mm for the thinner phosphor screen and the thicker phosphor screen, respectively. At the same time, the X-ray absorption efficiency of the thicker phosphor screen is 47% as compared to 29% for the thinner phosphor screen. In practical designs, the MTF of the thinner phosphor screen would exceed the MTF of the thicker phosphor screen such that the spatial frequency at which the MTF is 50% ($f_{1/2}$) for the first phosphor screen is higher than that for the second phosphor screen by at least 0.5 c/mm. In addition, the X-ray absorption efficiency of the second phosphor screen would exceed that of the first phosphor screen by at least 10%. The imaging array is capable of reading the resulting image from each of phosphor screens, so that the combined image can provide higher quality than is available with conventional DR systems with a single phosphor screen.

The material composition of the phosphor screens useful in the embodiments of the invention can include one or more of $Gd_2O_2S$:Tb, $Gd_2O_2S$:Eu, $Gd_2O_3$:Eu, $La_2O_2S$:Tb, $La_2O_2S$, $Y_2O_2S$:Tb, CsI:Tl, CsI:Na, CsBr:Tl, NaI:Tl, $CaWO_4$, $CaWO_4$:Tb, $BaFBr$:Eu, BaFCl:Eu, $BaSO_4$:Eu, $BaSrSO_4$, $BaPbSO_4$, $BaAl_{12}O_{19}$:Mn, $BaMgAl_{10}O_{17}$:Eu, $Zn_2SiO_4$:Mn, (Zn,Cd)S:Ag, LaOBr, LaOBr:Tm, $Lu_2O_2S$:Eu, $Lu_2O_2S$:Tb, $LuTaO_4$, $HfO_2$:Ti, $HfGeO_4$:Ti, $YTaO_4$, $YTaO_4$:Gd, $YTaO_4$:Nb, $Y_2O_3$:Eu, $YBO_3$:Eu, $YBO_3$:Tb, or (Y,Gd)$BO_3$:Eu, or combinations thereof. The phosphor screens, for instance, can be of the same or of different material composition. For example, the phosphor screens may have the same phosphor material but with different particle size distributions, particle-to-binder ratios, packaging densities, or absorbing dye. The median particle size of phosphor material on the second phosphor screen may be in the range from about 1 to about 5 microns, whereas the median particle size of phosphor material on the first phosphor screen may be in the range from about 6 to about 15 microns.

The atomic number of heavy elements may differ in phosphor screens useful in the embodiments of the invention. For example, for higher X-ray energy absorption, the second phosphor screen may have a composition having an element of higher atomic number than that of the first phosphor screen. In one instance, the second phosphor screen may contain $Gd_2O_2S$:Tb while the first phosphor screen may contain $Y_2O_2S$:Tb. Gadolinium (Gd) has an atomic number of 64, whereas yttrium (Y) has an atomic number of 39.

Moreover, the spatial frequency response of phosphor screens useful in the embodiments of the invention may be different with the use of different phosphor materials with different structures. For example, the second phosphor screen may comprise a columnar structured phosphor such as CsI:Tl, while the first phosphor screen may comprise a powder phosphor such as $Gd_2O_2S$:Tb. When evaporated under appropriate conditions, a layer of CsI will condense in the form of needle-like, closely packed crystallites with high packing density. Such a columnar or needle-like phosphor is well known in the art. See, for example, ALN Stevels et al., "Vapor Deposited CsI:Na Layers: Screens for Application in X-Ray Imaging Devices," Philips Research Reports 29:353-362 (1974); and T. Jing et al, "Enhanced Columnar Structure in CsI Layer by Substrate Patterning", IEEE Trans. Nucl. Sci. 39: 1195-1198 (1992). In this form, the spatial frequency response (or resolution) is improved over that for a powder phosphor screen of the same thickness, presumably because the columnar crystallites enhance the forward scattering of the light compared to a powder phosphor screen. These columns can be thought to act like fiber optic light guides such that light photons produced by the absorption of an incident X-ray will be guided toward either end of the pillars. Similar to powder screens, a reflective backing is used to maximize the light collection capabilities of the layer by redirecting light photons toward the exit surface. For example, the second phosphor screen may have a CsI:Tl layer with a thickness of 89 microns, while the first phosphor screen may have a $Gd_2O_2S$:Tb layer with a thickness of 93 microns. The spatial frequency response of the second phosphor screen may be higher than that of the first phosphor screen. The values of the spatial frequency at which the MTF equals 50% ($f_{1/2}$) are 4.7 c/mm and 3.3 c/mm for the second and first phosphor screens, respectively.

In these dual screen devices, x-ray radiation generally is incident on the side of the imaging device having the thinner phosphor screen, i.e., the thinner screen is arranged closer to the x-ray source. In this manner, MTF of the thinner screen is optimized. Alternatively, x-ray radiation may be incident on the thicker of phosphor screens, such that the SNR of the thicker screen is optimized.

Also in the dual screen devices, thicknesses t1, t2 of the scintillator layers may be scaled in order to optimize optical absorption lengths. For example, thicknesses exceeding one or more absorption length can be beneficial for reducing optical crosstalk.

Also in the embodiments described above, the light shield may be metal or some other opaque material and may also provide an electrical connection, such as a contact, for example. The light shield additionally/alternatively may be a colorant and/or a semiconductor.

When more than one photosensor is present in the foregoing embodiments, they may be identical, exhibiting the same overall response to incident radiation of different wavelengths. However, in other embodiments, the photosensors may have different sensitivity characteristics, "tuned" to match the emission characteristics of their corresponding scintillator layer. For example, one scintillator layer may emit light with a peak value near 500 nm and the other scintillator layer, could have a different phosphor material, which may emit light with a peak value near 550 nm, for example.

Fabrication

As noted in the foregoing embodiments, the photosensors and/or the readout elements are disposed directly on the scintillator layer according to the invention, without an intervening substrate. In one method of forming this apparatus, these imaging components are fabricated directly on the scintillator layer using known fabrication techniques. Preferred embodiments of this method include using $Gd_2O_2S$:Tb as the scintillator layer. Moreover, to ensure proper formation of the imaging components on the scintillator, generally it is desirable to maintain a planarity of the scintillator layer to within 20 nm RMS.

In another preferred embodiment, the imaging components may be formed first on an intermediate or temporary substrate, then laminated onto the scintillator layer. One method using the intermediate substrate includes forming a release layer on the intermediate substrate. Then the array consisting of photosensors and thin-film transistor readout elements are formed on the release layer. Next, radiant energy, heat, pressure, or other energy is applied to the release layer in order to separate it from the intermediate substrate. The release layer or some other substance or process then may be used to adhere or otherwise bond the array of imaging pixels to the scintillator to form an imaging panel. The release layer used in accordance with the invention may be organic or inorganic and may be chemically-, optically-, or thermally-activated. Known release layers include ProLIFT, commercially available from Brewer Science and HD-3007 polyimide adhesive, a laser-activated release commercially available from HD Microsystems. The release layer also may include polybenzoxazole.

In another method of fabricating arrays on a scintillator, a temporary substrate is provided. Like in the embodiment just described, a release layer is formed on a substantially planar surface of the temporary substrate and the imaging array, including photosensitive elements and switching elements, is formed on the release layer. While the array and release layer are still disposed on the temporary substrate, the scintillator is bonded on the imaging array. The release layer is thereafter activated, to separate the imaging array (with scintillator bonded thereto) from the temporary substrate. Accordingly, an imaging array as exemplified in FIG. 2 is obtained.

The release layer preferably is an organic or an inorganic material that can be thermally-, optically-, and/or chemically-activated. For example, in one embodiment the release layer is activated using etching techniques. In such an embodiment, a barrier layer may be used between the release layer and the imaging array and the etch used has a high selectivity of etch rate to the barrier layer, to avoid damaging the imaging array. The etch could be, for example, a xenon difloride gas. In yet another embodiment, the release layer may include a colorant. To activate the release layer, radiant energy is directed to the release layer and the colorant absorbs at least a portion of the radiant energy. The release layers described above also may be used in this embodiment.

While the barrier layer may be include to act as an etch stop, a barrier layer may be formed between the imaging array and the scintillator, to form a device such as that illustrated in FIG. 3. In still other embodiments, a planarization layer may be formed on the imaging array prior to boding the scintillator, to provide a substantially planar surface upon which the scintillator is bonded.

Variations of the foregoing methods also are contemplated and can be used to form the preferred imaging arrays of the present invention. For example, once the imaging array and scintillator are removed from the temporary substrate, a second scintillator can be bonded on the surface of the imaging array exposed upon such removal. Preferably, the second scintillator has properties different from the properties of the first scintillator. Adding the second scintillator in this manner will form devices such as those shown in FIGS. 4 and 5. Moreover, two arrays with bonded substrates may be laminated after construction using an adhesive or the like, to produce the array exemplified in FIGS. 6 and 7. The remaining illustrated arrays can be formed in like manner by appropriately forming the imaging arrays on the release layer. Barrier layers also can be formed using known methods to yield the desired pixel structure.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention.

For example, although photodiodes were used as the exemplary light sensing elements in the foregoing embodiments, the invention is not limited in this regard. Any photosensitive element could be used, including, but not limited to, metal-insulating-semiconductors, p-n junction photodiodes, PIN photodiodes, pinned photodiodes, charge-injection-devices, charge-coupled devices, and phototransistors. The invention also is not limited TFTs as the readout elements. Any of MOS transistors, bipolar transistors, diode switches, charge-injection-devices, and charge-coupled devices could be used. Moreover, the imaging array may be formed in any of amorphous silicon, polycrystalline silicon, single-crystal silicon, organic semiconductors, and one or more of binary, ternary, or quaternary semiconductors containing one of indium, zinc, oxygen, and gallium, or any combination thereof.

Thus, what is provided is an imaging array of photosensors and thin-film transistor readout devices formed directly on a scintillating phosphor screen.

PARTS LIST

10. Imaging pixel
12. Phosphor screen
14. Passivization layer
16. Indium-tin-oxide layer
18. p-doped Si layer
20. a-Si:H layer
22. n-doped Si layer
24. Metal layer
26. Dielectric layer
28. Glass substrate
30. X-ray photon path
32. Visible light photon path 70. Photodiode
71. TFT switch
80. Flat panel imager
81. Sensor array
82. Driver chip
83. Gate lines
84. Data line
85. Bias line
86. Amplifier
87. Multiplexer
88. A-D converter
110, 210, 310, 410, 510, 610, 710, 810, 910, 1010, 1110, 1210. Pixel element
112, 212, 312, 412, 512, 612, 712, 812, 912, 1012, 1112, 1212. (First) Photosensor
513, 613, 713, 813, 913, 1013, 1113, 1213. Second Photosensor
114, 214, 314, 414, 614, 714, 814, 914, 1114, 1214. TFT readout element
1016, 1116, 1216. Third Photosensor
522, 622, 722, 822, 922, 1022, 1122, 1222. Light shield layer
130, 230, 330, 430, 530, 630, 730, 830, 930, 1030, 1130, 1230. (First) Scintillator layer
331, 431, 531, 631, 731, 831, 931, 1031, 1131, 1231. Second Scintillator layer
232, 432. Barrier layer
t1, t2. Thickness

The invention claimed is:

1. An apparatus comprising:
   a flat panel radiographic imaging device that includes:
      a substantially planar scintillator layer comprising only a scintillating material and a binder, the scintillator layer having a top surface and a bottom surface opposite the top surface, the scintillator layer having no substrate layer for providing support thereto; and
      a two dimensional planar array of imaging pixels formed over the top surface of the scintillator layer, each of the imaging pixels comprising a photosensor and a readout element, the readout element configured to transmit electric charge from the photosensor, the array of imaging pixels having no substrate layer for providing support thereto, the array of imaging pixels configured to generate a radiographic image from a single pulse of radiographic energy transmitted into the scintillator layer; and
   readout circuitry electrically connected to the array of imaging pixels to electronically stream out the radiographic image.

2. The apparatus of claim 1, wherein the array of imaging pixels comprises amorphous silicon, polycrystalline silicon, single-crystal silicon, or organic semiconductors, and one or more of binary, ternary, or quaternary semiconductors containing indium, zinc, oxygen, or gallium.

3. The apparatus of claim 1, wherein the array of imaging pixels is formed directly on the scintillator layer.

4. The apparatus of claim 1, further comprising a barrier layer formed on the scintillator layer, and wherein the array of imaging pixels is formed directly on the barrier layer.

5. The apparatus of claim 1, wherein at least a portion of the scintillator layer having the array of imaging pixels formed thereon comprises a planarity within about 20 nm RMS.

6. The apparatus of claim 1, wherein each of the photosensors includes a metal-insulating-semiconductor, a p-n junction photodiode, a PIN photodiode, a pinned photodiode, a charge-injection-device, a charge-coupled device, or a phototransistor.

7. The apparatus of claim 1, wherein each of the readout elements includes a thin film transistor, a MOS transistor, a bipolar transistor, a diode switch, a charge-injection-device, or a charge-coupled device.

8. The apparatus of claim 1, further comprising another scintillator layer formed on the planar array of imaging pixels such that the planar array of imaging pixels is disposed between the substantially planar scintillator layer and said another scintillator layer.

9. The imaging panel of claim 8, wherein an X-ray absorption efficiency of the substantially planar scintillator layer and said another scintillator layer differ by at least 10%.

10. The apparatus of claim 1, further comprising:
   a barrier layer formed directly on the planar array of imaging pixels; and
   another scintillator layer formed directly on the barrier layer.

11. The apparatus of claim 1, wherein the scintillating material comprises at least one of $Gd_2O_2S:Tb$, $Y_2O_2S:Tb$, CsI:Tl, $CaWO_4$, BaFBr:Eu, LaOBr, and LaOBr:Tm.

12. A method of making a radiographic imaging apparatus without a substrate layer in the form of a planar flat panel, the method comprising:
   providing a planar temporary substrate, the temporary substrate comprising a planar construction having a top surface and a bottom surface opposite the top surface;
   forming a release layer on the top surface of the temporary substrate;
   forming a two-dimensional array of imaging pixels over the release layer, the array of imaging pixels each comprising a photosensor and a thin-film transistor readout element;
   bonding a scintillator layer over the array of imaging pixels, the scintillator layer consisting of a scintillating material and a binder, wherein the step of bonding forms the planar flat panel radiographic imaging apparatus; and
   activating the release layer to separate the flat panel imaging apparatus from the temporary substrate, wherein the step of activating forms said planar flat panel radiographic imaging apparatus without a substrate.

13. The method of claim 12, further comprising forming the array of imaging pixels directly on the release layer.

14. The method of claim 12, further comprising forming a barrier layer on the release layer and forming the array of imaging pixels directly on the barrier layer.

15. The method of claim 12, further comprising bonding the scintillator layer directly on the array of imaging pixels.

16. The method of claim 12, further comprising forming a barrier layer on the array of imaging pixels and bonding the scintillator layer on the barrier layer.

17. A flat panel radiographic imaging apparatus comprising:
   a scintillator layer, the scintillator layer being substantially planar and having a top surface and a bottom surface opposite the top surface, the scintillator layer consisting of a scintillating material and a binder;
   a two dimensional planar array of imaging pixels formed on the top surface of the scintillator layer and configured to capture a radiographic image, each of the imaging pixels comprising a photosensor and a thin film transistor, the thin film transistor in each pixel electrically connected to the photosensor; and readout circuitry electrically connected to each of the thin film transistors for reading out the radiographic image captured by the array of imaging pixels.

18. The apparatus of claim 17, wherein the imaging pixels are configured to generate the radiographic image from a single pulse of radiographic energy transmitted into the scintillator layer.

19. The apparatus of claim 17, wherein the array of imaging pixels comprises amorphous silicon, polycrystalline silicon, single-crystal silicon, or organic semiconductors, and one or more of binary, ternary, or quaternary semiconductors containing indium, zinc, oxygen, or gallium.

* * * * *